US008207736B2

(12) United States Patent
Chu et al.

(10) Patent No.: US 8,207,736 B2
(45) Date of Patent: Jun. 26, 2012

(54) APPARATUS FOR FEEDING A MAGNETIC RESONANCE COIL ELEMENT AND METHOD OF MAKING SAME

(75) Inventors: Dashen Chu, Hartland, WI (US); Robert S. Stormont, Hartland, WI (US); Saban Kurucay, Menomonee Falls, WI (US); Scott A. Lindsay, Dousman, WI (US); Ricardo M. Matias, Brookfield, WI (US); Anthony D. Defranco, Pittsburgh, PA (US)

(73) Assignee: General Electric Company, Schenectady, NY (US)

( * ) Notice: Subject to any disclaimer, the term of this patent is extended or adjusted under 35 U.S.C. 154(b) by 499 days.

(21) Appl. No.: 12/570,759

(22) Filed: Sep. 30, 2009

(65) Prior Publication Data

US 2011/0074425 A1    Mar. 31, 2011

(51) Int. Cl.
*G01V 3/00* (2006.01)
(52) U.S. Cl. .................................. 324/322; 324/318
(58) Field of Classification Search .................. 324/322, 324/318, 311, 314
See application file for complete search history.

(56) References Cited

U.S. PATENT DOCUMENTS

| 4,691,164 A  * | 9/1987  | Haragashira ................. 324/322 |
| 5,347,222 A  * | 9/1994  | Fox et al. ....................... 324/322 |
| 6,160,400 A  * | 12/2000 | Friedrich et al. .............. 324/322 |
| 7,180,291 B2   | 2/2007  | Chmielewski et al. |
| 7,227,361 B2   | 6/2007  | Okamoto et al. |
| 7,408,351 B2   | 8/2008  | Yoshida |
| 7,501,824 B2   | 3/2009  | Kawachi et al. |
| 7,511,498 B2   | 3/2009  | Fujimoto et al. |
| 7,583,083 B2 * | 9/2009  | Biber et al. ................... 324/318 |
| 7,847,549 B2   | 12/2010 | Takahashi et al. |

OTHER PUBLICATIONS

Hoult et al., "The Quantum Origins of the Free Induction Decay Signal and Spin Noise," Journal of Magnetic Resonance, vol. 148, 2001, pp. 182-199.
Smith et al., "Surface Coils with Integrated Differential Amplifiers," Proc. Intl. Soc. Mag. Reson. Med., vol. 14, 2006, p. 2618.
Ramirez et al., "Resonance Shift Decoupling: A Potential Alternative to Low Input Impedance Preamplifiers," Proc. Intl. Soc. Mag. Reson. Med., vol. 17, 2009, p. 103.

* cited by examiner

*Primary Examiner* — Louis Arana
(74) *Attorney, Agent, or Firm* — Ziolkowski Patent Solutions Group, SC

(57) ABSTRACT

A method, system, and apparatus including a magnetic resonance (MR) coil system that includes an MR coil element, a high input Pre-amplifier having a high input impedance field-effect-transistor (FET) with an impedance of one of substantially equal to 500 ohms and greater than 500 ohms, and a conductive path. The conductive path has a first end coupled to the MR coil element and a second end coupled to the high input Pre-amplifier such that the MR coil element is coupled in series with the high input Pre-amplifier. Further, the conductive path is free of a matching network intervening between the MR coil element and the high input Pre-amplifier.

20 Claims, 4 Drawing Sheets

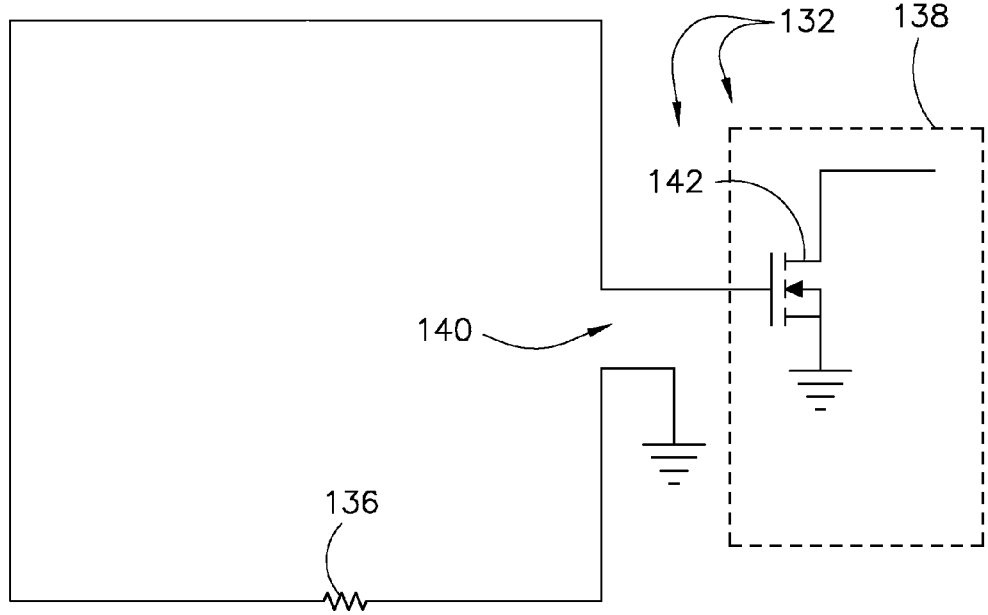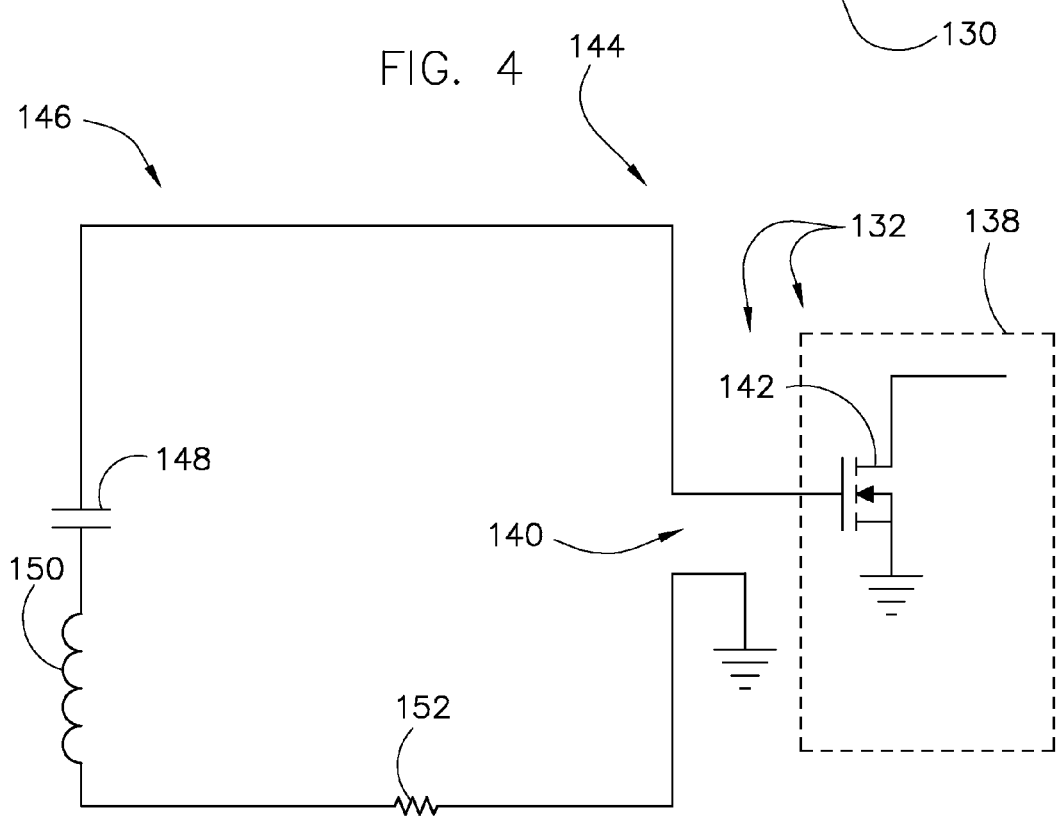

APPARATUS FOR FEEDING A MAGNETIC RESONANCE COIL ELEMENT AND METHOD OF MAKING SAME

BACKGROUND OF THE INVENTION

Embodiments of the invention relate generally to a magnetic resonance (MR) coil elements and, more particularly, to decreasing interference among MR coil elements.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Often, a phased array is used during MR imaging. A phased array includes a plurality of radio-frequency (RF) coils or coil elements. Typically, the RF coil elements of an array are configured to minimize interference caused by cross-talk between other RF coil elements of the phased array. For example, interference may be caused by inductive coupling, where one coil element inductively induces a current into another coil element. Inductive coupling becomes more predominant as coil density or coil channel count increases. Generally, inductive coupling tends to increase correlated noise between coil elements of an array. As such, the signal-to-noise ratio (SNR) of each coil generally degrades, thus degrading the performance of the RF coil array. Cross-talk interference may also be caused by inductive coupling between transmit and receive coils. For example, inductive coupling caused by resonance between an MR whole-body transmit coil, which produces the excitation field, $B_1$, and one or more receive coils can cause interference, thus degrading resulting image quality.

There are a variety of known techniques implemented to isolate or minimize cross-talking among coil elements of an array or among a transmit/receive coil combination of two or more coils. Traditionally, a circuit that includes an MR coil element, a feeding scheme that employs a matching network, and a low input Pre-amplifier (Pre-amp) are employed to reduce RF current in RF coils to improve the isolations between RF coils of an array, thus reducing interference. Blocking impedance resulting from such a circuit layout, however, is generally limited. For example, the actual blocking impedance, which is generated by the matching network, is often on the order of 100 to 500 ohms, depending on the coil size and loading. As coil element size decreases, so does the blocking impedance.

Another technique employed to minimize cross-talk between coil elements attempts to improve the blocking efficiency of matching networks by feeding RF coils in series with differential Pre-amps. However, a poor noise match between the differential Pre-amps and the RF coil may result in poor SNR. That is, poor SNR can be caused by a poor noise match between the high noise impedance of the differential Pre-amp and the impedance of the source.

It would therefore be desirable to have a method and system capable of at least providing an improved blocking impedance to RF coils in an RF coil array and having the ability to be noise matched with a variety of source impedances presented by RF coils without using a matching network.

BRIEF DESCRIPTION OF THE INVENTION

Embodiments of the invention provide a system and method of minimizing interference in MR imaging and more particularly, increasing isolation between RF coil elements.

In accordance with an aspect of the invention, a magnetic resonance (MR) coil system includes an MR coil element, a high input Pre-amplifier having a high input impedance field-effect-transistor (FET) with an impedance of one of substantially equal to 500 ohms and greater than 500 ohms, and a conductive path. The conductive path has a first end coupled to the MR coil element and a second end coupled to the high input Pre-amplifier such that the MR coil element is coupled in series with the high input Pre-amplifier. Further, the conductive path is free of a matching network intervening between the MR coil element and the high input Pre-amplifier.

In accordance with another aspect of the invention, a method of forming a circuit includes forming a conductive path from a high input impedance field-effect-transistor (FET) to a magnetic resonance (MR) coil element, coupling the high input impedance FET to a first end of the conductive path, and coupling the MR coil element to a second end of the conductive path such that the MR coil element is coupled in series to the high input impedance FET. The conductive path is free of a matching network. Further, the MR coil element is configured to provide an output impedance different than an impedance of the high input impedance FET, and the high input impedance FET is configured to noise match the output impedance of the MR coil element.

In accordance with yet another aspect of the invention, a magnetic resonance (MR) system includes a high input Pre-amplifier having a first stage, a conductive path coupled to the first stage of the high input Pre-amplifier, and an MR coil directly fed to the first stage of the high input Pre-amplifier via the conductive path. The first stage of the high input Pre-amplifier is configured to have a noise circle that at least substantially encompasses an output impedance of the MR coil element. Further, the output impedance of the MR coil is different than an input impedance of the high input Pre-amplifier.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings:

FIG. 3 is a circuit diagram of a high input feeding scheme to an MR coil element according to an embodiment of the invention.

FIG. 4 is a circuit diagram of a high input feeding scheme to an MR coil element according to another embodiment of the invention.

DETAILED DESCRIPTION

Embodiments of the invention may be employed with magnetic resonance (MR) imaging systems.

Figure 1:
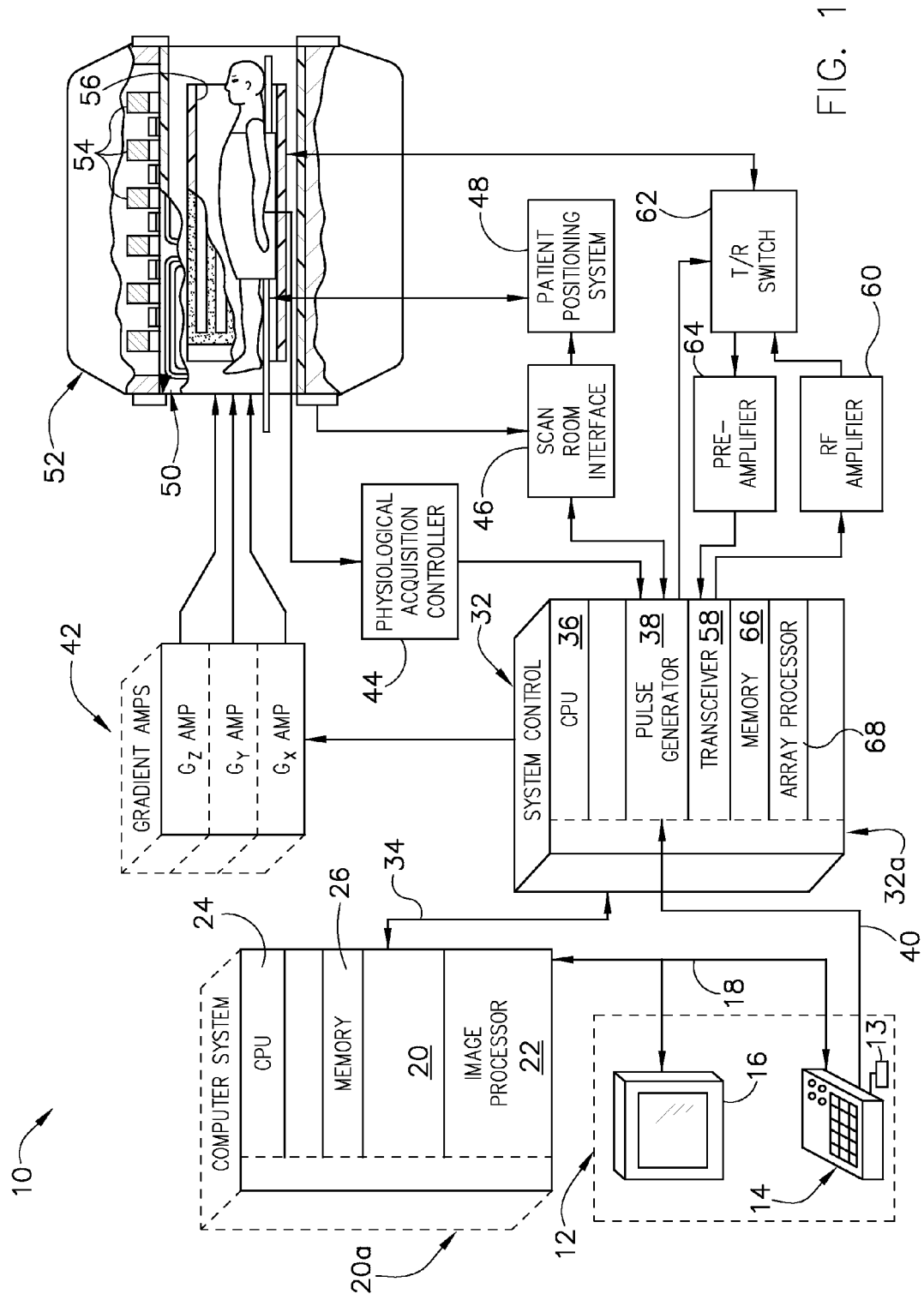
FIG. 1 is a schematic block diagram of an exemplary MR imaging system capable of use with embodiments of the present invention.

Referring to FIG. 1, the major components of an exemplary magnetic resonance imaging (MRI) system 10 capable of use with embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a Pre-amplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the Pre-amplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
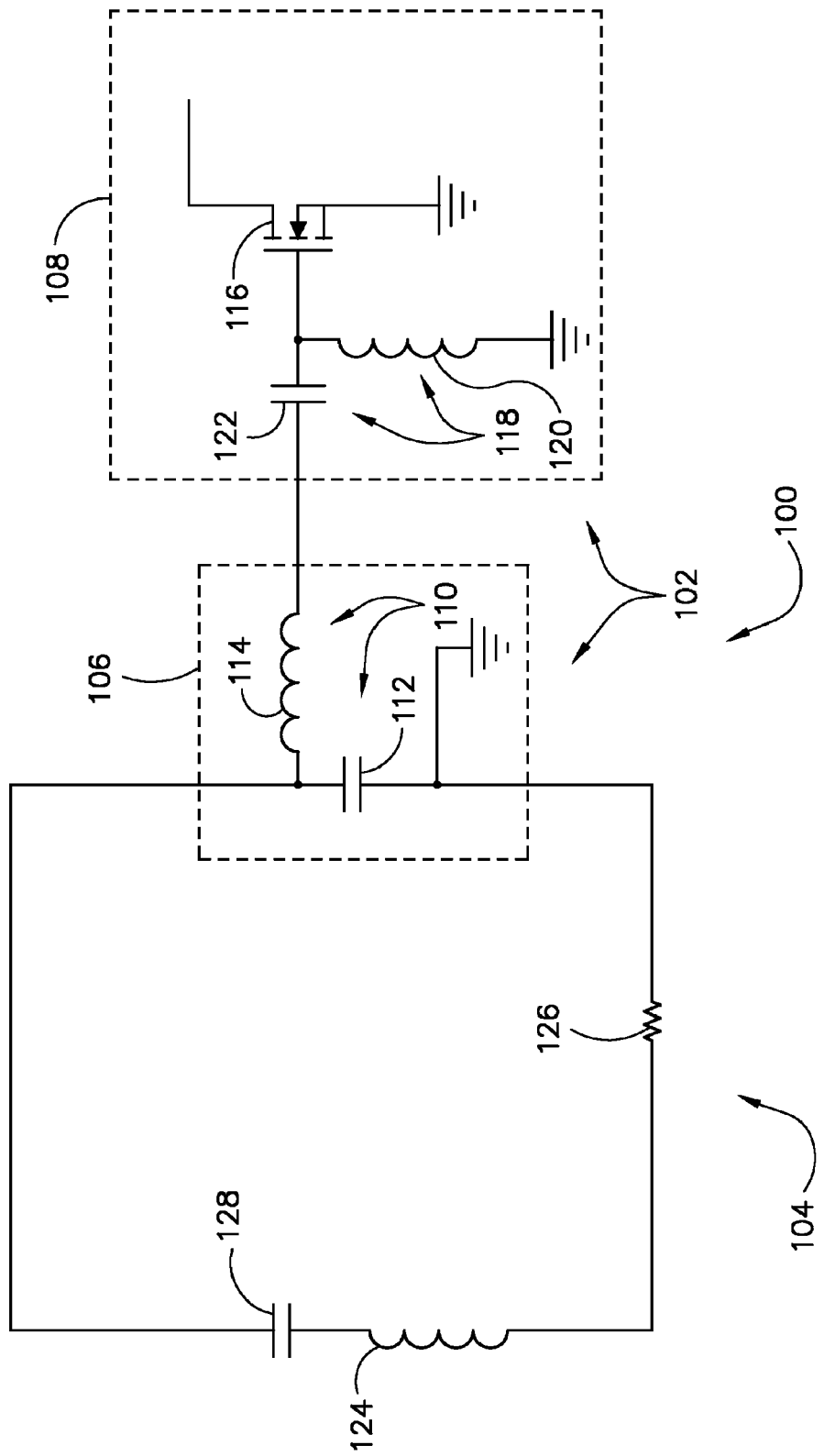
FIG. 2 is a circuit diagram of a prior art low input feeding scheme to an MR coil element.

Referring now to FIG. 2, a circuit diagram 100 depicting a prior art low input feeding scheme 102 to an MR coil element 104 is shown. Low input feeding scheme 102 includes a matching network 106 and a low input Pre-amplifier first stage 108.

Matching network 106 includes a matching transformer 110, which includes a matching capacitor 112 and a matching inductor 114. Low input Pre-amplifier first stage 108 includes a traditional field-effect-transistor (FET) 116 and a impedance transformer 118, which includes an inductor 120 and a capacitor 122.

MR coil element 104, having an inductance 124 and a resistance 126, includes a first capacitor 128. Typically, MR coil element 104 has a capacitance 128 that is tuned in such a manner that MR coil element 104 functions at a frequency that resonates with a body coil (e.g., whole-body RF coil 56 of FIG. 1) of an MR apparatus (e.g., MR system 10 of FIG. 1) if both MR coil 104 of FIG. 2 and the body coil are operating simultaneously. Such resonance may result in unwanted noise interference. As such, MR coil elements such as MR coil element 104 are typically switched off while the MR apparatus body coil is operating.

Traditionally, matching network 106 produces a fifty ohm output impedance from MR coil element 104 by matching the capacitor impedance, $X_c$, of matching capacitor 112 to the inductor impedance, $X_1$, of matching inductor 114. In such an instance, $X_c = X_1 = \text{Sqrt}(R_c * 50)$, where $R_c$ is coil resistance 124 of coil element 104 with loading.

While matching network 106 typically produces a 50 ohm output impedance from MR coil 104 in the direction of low input impedance Pre-amplifier first stage 108, Pre-amp transformer 118 generally transforms high input impedance of FET 116 into low impedance (e.g., 1 to 2 ohms). Alternatively, a ¼-wavelength transmission line (not shown), rather than a transformer such as Pre-amp transformer 118, may be employed to transform high input impedance of FET 116 into a low input impedance.

With low input impedance Pre-amp 108 connected to matching network 106, matching inductor 114 resonates with matching capacitor 112, thus matching network 106 generates high blocking impedance to MR coil element 104. The generated high blocking impedance helps to reduce RF current in MR coil element 104. Pre-amp transformer 118 also converts an output of matching network 106 (e.g., 50 ohms) to a high-impedance source for FET 116 for noise matching purposes to yield an effective SNR. Without matching network 106, FET 116 and MR coil element 104 would not be properly noise matched, thus leading to low SNR in resulting MR images.

The input impedance of low input impedance Pre-amp first stage 108 generally cannot be made arbitrarily low due to stability considerations. Further, the impedance of matching inductor 114 is generally determined by the square root of the product of, for example, 50 ohms and the loading resistance (R) of MR coil element 104, which is generally from 5 to 50 ohms. As such, the actual blocking impedance is often limited. For example, matching networks such as matching network 106 often produce a blocking impedance that is on the order of 100 to 500 ohms, depending on the coil size and loading. As the size of MR coil element 104 decreases, so does the blocking impedance.

Referring now to FIG. 3, a circuit diagram 130 depicting a high input feeding scheme 132 for an MR coil element 134 having a resistance 136 is shown according to an embodiment of the invention. According to high input feeding scheme 132, a high input Pre-amplifier first stage 138 is directly coupled in series to MR coil element 134. As depicted, a matching network such as matching network 106 of FIG. 1 is not employed in high input feeding scheme 132 represented in FIG. 2. Rather, the impedance of MR coil element 134 is directly fed to high input Pre-amplifier first stage 138 along a conductive path 140. According to the present embodiment, high input Pre-amplifier first stage 138 includes a high input impedance FET 142.

High input impedance FET 142 has a low noise reflection coefficient, γ, and a low noise resistance, $R_n$. Preferably, high input impedance FET 142 may have a source reflection coefficient of γ substantially equal to 0.0 and a normalized noise resistance of $R_n$ substantially equal to 0.0 in addition to the low noise figure. However, γ values substantially equal to or less than 0.1 and $R_n$ values substantially equal to or less than 0.2 are also contemplated. With high input impedance FET 142 having the appropriate γ and $R_n$ values, high input Pre-amplifier first stage 138 provides a blocking impedance for MR coil element 134 while also providing a large noise circle in the context of a Smith Chart. As such, current in MR coil element 134 is minimized, and a high input impedance of high input impedance FET 142 is effectively noise matched with MR coil element 134 output impedance. Having a large noise circle, high input Pre-amplifier first stage 138 yields an effective SNR over a variety of RF coil impedances while producing a high blocking impedance to MR coil element 134. Accordingly, a matching network such as matching network 106 of FIG. 2 is not needed to produce an effective SNR.

Referring now to FIG. 4, a circuit diagram 144 depicting high input feeding scheme 132 for an MR coil element 146 is shown according to another embodiment of the invention. In contrast to an embodiment depicted in FIG. 3, MR coil element 146 of FIG. 4 includes a capacitance 148, an inductance 150, and a resistance 152, where capacitance 148 and inductance 150 can be manipulated or tuned such that MR coil element 146 can operate at a first frequency.

According to an embodiment of the invention, a tuning process can be employed to effectively cancel the reactance of MR coil element 146. In such an embodiment, the impedance of capacitor 148 coupled to MR coil element 146 and the impedance of inductance 150 are matched to eliminate the phase angle from MR coil element 146, thus yielding ideal noise matching.

A tuning scheme may also be employed to ensure that MR coil element 146 will not resonate if an MR apparatus body coil (e.g., whole body RF coil 56 of FIG. 1) and MR coil element 146 of FIG. 4 are simultaneously functioning. For example, according to an embodiment of the invention, MR coil element 146 may be tuned to a frequency off-resonant from an MR body coil while still maintaining a proper noise match between MR coil impedance output and the impedance at high input impedance FET 142. In such an embodiment, since MR coil 134 is tuned to a frequency off-resonant from the MR body coil, MR coil 134 and the MR body coil can operate simultaneously without causing resonance therebetween. As such, noise in resulting images are minimized.

Typically, MR coils or elements are tuned to whole-body coils. Due to the negative effects that resonance can cause on an MR image, MR receive coils are generally "turned off" while a MR body coil transmits and are "turned on" when the MR body coil is no longer transmitting. In contrast, embodiments of the present invention allow for simultaneous operation of MR coil element 134 and an MR apparatus body coil such as whole-body RF coil 156 of FIG. 1 since MR coil element 146 of FIG. 4 is, at least in one embodiment, tuned to a frequency off-resonant from the body coil.

In a manner similar to embodiments of FIG. 3, high input impedance FET 142 of FIG. 4 may have source reflection coefficient that ranges from 0.0 to substantially 0.1 and a normalized noise resistance that ranges from 0.0 to substantially 0.2 to enable production of an effective noise match to MR coil element 134 without a matching network.

Figure 5:
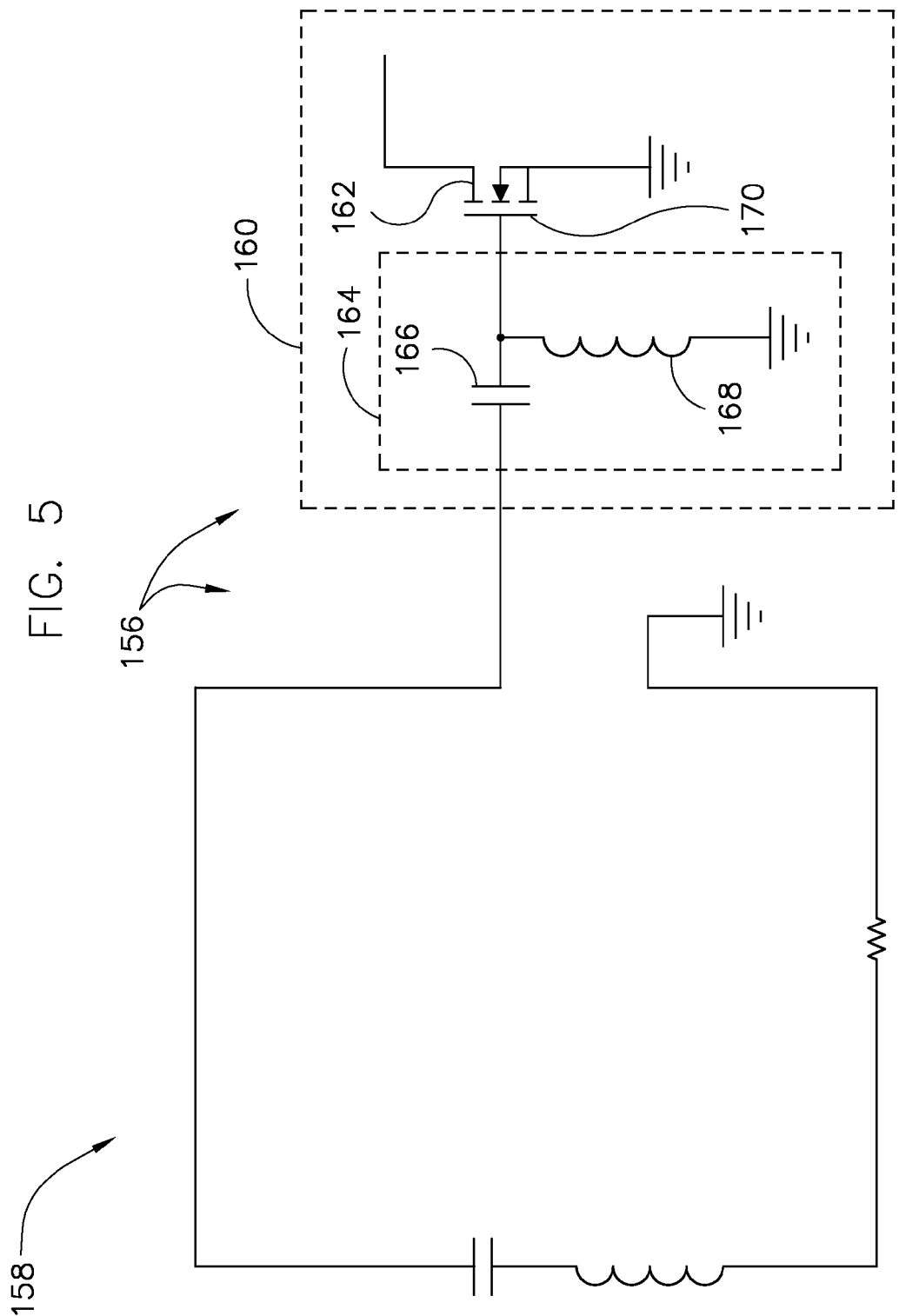
FIG. 5 is a circuit diagram of a high input feeding scheme to an MR coil element according to yet another embodiment of the invention.

Referring now to FIG. 5, a circuit diagram 154 depicting a feeding scheme 156 for an MR coil 158 is shown according to another embodiment of the invention. According to feeding scheme 156, a high input Pre-amplifier first stage 160 is directly coupled to MR coil 158. As shown in FIG. 5, a matching network such as matching network 106 of FIG. 1 is not employed in feeding scheme 156 of FIG. 5.

High input Pre-amplifier first stage 160 includes a high input impedance FET 162 and an impedance transformer 164 that includes a first capacitor 166 and a first inductor 168. High input impedance FET 162 may have source reflection coefficient that ranges from 0.0 to substantially 0.1 and a normalized noise resistance that ranges from 0 to substantially 0.2. Preferably, high input impedance FET 162 has a source reflection coefficient of substantially 0.0 and a normalized noise resistance of substantially 0.2. However, as discussed above, other source reflection and normalized noise resistance values are contemplated.

Impedance transformer 164 can be configured to alter the impedance of FET 162 to effectively cancel out a reactance of high input impedance FET 162, such as capacitance caused by a parasitic capacitance effect. Parasitic capacitance effects can be caused by, for example, a printed circuit board (PCB) layout of high input impedance FET 162 or by a gate 170 of high input impedance FET 162. Further, such reactance can often increase as the frequency increases. Advantageously, however, configuring impedance transformer 164 of high input Pre-amplifier first stage 160 to cancel, or at least minimize, reactance maintains a high impedance (i.e. a blocking impedance) to MR coil element 158 and an effective SNR without having a substantial impact on the noise figure of FET 162.

Accordingly, high input impedance FETs 142, 162 of FIGS. 3, 4, and 5, each having a low source reflection coefficient and a low noise resistance, provide a high blocking impedance and an effective noise match over a broad source input impedance from a very large variety of RF coil loadings without the need to rely on matching networks.

In accordance with one embodiment, a magnetic resonance (MR) coil system includes an MR coil element, a high input Pre-amplifier having a high input impedance field-effect-transistor (FET) with an impedance of one of substantially equal to 500 ohms and greater than 500 ohms, and a conductive path. The conductive path has a first end coupled to the MR coil element and a second end coupled to the high input Pre-amplifier such that the MR coil element is coupled in series with the high input Pre-amplifier. Further, the conductive path is free of a matching network intervening between the MR coil element and the high input Pre-amplifier.

In accordance with another embodiment, a method of forming a circuit includes forming a conductive path from a high input impedance field-effect-transistor (FET) to a magnetic resonance (MR) coil element, coupling the high input impedance FET to a first end of the conductive path, and coupling the MR coil element to a second end of the conductive path such that the MR coil element is coupled in series to the high input impedance FET. The conductive path is free of a matching network. Further, the MR coil element is configured to provide an output impedance different than an impedance of the high input impedance FET, and the high input impedance FET is configured to noise match the output impedance of the MR coil element.

In accordance with yet another embodiment, a magnetic resonance (MR) system includes a high input Pre-amplifier having a first stage, a conductive path coupled to the first stage of the high input Pre-amplifier, and an MR coil directly fed to the first stage of the high input Pre-amplifier via the conductive path. The first stage of the high input Pre-amplifier is configured to have a noise circle that at least substantially encompasses an output impedance of the MR coil element. Further, the output impedance of the MR coil is different than an input impedance of the high input Pre-amplifier.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance (MR) coil system comprising
an MR coil element;
a high input Pre-amplifier comprising a high input impedance field-effect-transistor (FET) having an impedance of one of substantially equal to 500 ohms and greater than 500 ohms; and
a conductive path having a first end coupled to the MR coil element and having a second end coupled to the high input Pre-amplifier such that the MR coil element is coupled in series with the high input Pre-amplifier, the conductive path free of a matching network intervening between the MR coil element and the high input Pre-amplifier.

2. The MR coil system of claim 1 wherein the high input Pre-amplifier is configured to have a noise circle that at least substantially encompasses an output impedance of the MR coil element.

3. The MR coil system of claim 1 wherein the high input impedance FET has a normalized noise resistance in a first range from 0.00 to 0.2.

4. The MR coil system of claim 3 wherein the high input impedance FET has a source reflection coefficient in a second range from 0.0 to 0.1.

5. The MR system of claim 1 wherein the high input Pre-amplifier further comprises an impedance transformer coupled in series between the high input impedance FET and the MR coil element, wherein the impedance transformer is configured to substantially remove a gate reactance of the high input impedance FET.

6. The MR coil system of claim 5 wherein the impedance transformer comprises:
a capacitor; and
an inductor coupled in series with the capacitor and the high input impedance FET.

7. The MR coil system of claim 1 wherein the MR coil element comprises a first capacitor, and wherein the MR coil element is tuned via the first capacitor to a first frequency.

8. The MR coil system of claim 7 further comprising a transmit coil, and wherein the first frequency is different than an operating resonant frequency of the transmit coil.

9. The MR coil system of claim 1 wherein an inductor impedance of the MR coil element is substantially equal to a capacitor impedance of the MR coil element such that a phase angle of an output impedance of the MR coil element is substantially zero.

10. A method of forming a circuit comprising:
forming a conductive path from a high input impedance field-effect-transistor (FET) to a magnetic resonance (MR) coil element, wherein the conductive path is free of a matching network;
coupling the high input impedance FET to a first end of the conductive path; and
coupling the MR coil element to a second end of the conductive path such that the MR coil element is coupled in series to the high input impedance FET, the MR coil element configured to provide an output impedance different than an impedance of the high input impedance FET, and the high input impedance FET configured to noise match the output impedance of the MR coil element.

11. The method of claim 10 wherein forming a conductive path comprises coupling an impedance transformer in series with the high input impedance FET and the MR coil element.

12. The method of claim 11 further comprising tuning the impedance transformer such that a reactance at a gate of the high input impedance FET is substantially removed.

13. The method of claim 10 further comprising tuning the MR coil element to a first frequency different than an operating frequency of a body MR coil.

14. The method of claim 10 further comprising optimizing a capacitance of the MR coil element and an inductance of the MR coil element such that one of a phase angle of the output impedance and a reactance of the output impedance is substantially zero.

15. The method of claim 10 further comprising tuning the MR coil element such that a reactance of the MR coil is substantially removed.

16. A magnetic resonance (MR) system comprising:
a high input Pre-amplifier having a first stage;
a conductive path coupled to the first stage of the high input Pre-amplifier; and
an MR coil directly fed to the first stage of the high input Pre-amplifier via the conductive path, the first stage of the high input Pre-amplifier configured to have a noise circle that at least substantially encompasses an output impedance of the MR coil element, wherein the output impedance of the MR coil is different than an input impedance of the high input Pre-amplifier.

17. The MR system of claim 16 wherein the first stage of the high input Pre-amplifier comprises a high input impedance field-effect-transistor (FET).

18. The MR system of claim 17 wherein the first stage of the high input Pre-amplifier further comprises an impedance transformer coupled in series with the high input impedance FET and the MR coil.

19. The MR system of claim 17 further comprising a transmit coil configured to elicit signals to be received by the MR coil, and wherein the MR coil is tuned to a first frequency that is off-resonant from a frequency of the transmit coil.

20. The MR system of claim 17 wherein the high input impedance FET is configured to provide a high blocking impedance for the MR coil such that current in the MR coil is minimized.

* * * * *